United States Patent [19]

Leung

[11] Patent Number: 5,675,546
[45] Date of Patent: Oct. 7, 1997

[54] ON-CHIP AUTOMATIC PROCEDURES FOR MEMORY TESTING

[75] Inventor: Yu-Ying Jackson Leung, Sugar Land, Tex.

[73] Assignee: Texas Instruments Incorporated, Dallas, Tex.

[21] Appl. No.: 659,811

[22] Filed: Jun. 7, 1996

[51] Int. Cl.$^6$ .............................. G11C 7/00; G11C 29/00
[52] U.S. Cl. ................... 365/201; 365/185.09; 371/22.5
[58] Field of Search ............................... 365/201, 185.09, 365/230.02; 371/22.5, 40.1

[56] References Cited

U.S. PATENT DOCUMENTS

| | | | |
|---|---|---|---|
| 542,248 | 9/1895 | Naruke et al. | 365/185.09 |
| 5,068,827 | 11/1991 | Yamada et al. | 365/185.09 |

*Primary Examiner*—David C. Nelms
*Assistant Examiner*—Huan Hoang
*Attorney, Agent, or Firm*—Theodore D. Lindgren; Leo N. Heiting; Richard L. Donaldson

[57] ABSTRACT

The on-chip endurance test (Autocycle) and the parametric characterization test (Auto VccMax/Min) of this invention save test time and hardware by performance automatically on the memory chip upon transmittal of a single command (CONTROL CODE) to the chip from the tester. The automated test procedures of this invention run faster because the on-chip tester requires fewer externally issued commands (CONTROL CODEs) and requires fewer external status checks. The procedures of this invention permit the external tester to have a smaller number of input/output pins (CONTROL), decreasing the cost of the external test hardware. Specifically, the endurance test (Autocycle), automatically cycles the memory chip through any combination of programming, erasing, and/or compaction operations until either a failure has been detected or the required number of the test cycles has been completed. The parametric characterization test (AutoVccMax/Min) determines automatically the maximum supply voltage and/or the minimum supply voltage for data operation of the memory chip. The endurance test (Autocycle) uses a microsequencer (MC) and an on-chip built-in-logic-block-observation (BILBO) register to check information in a control-read-only memory (CROM). Output data from the control-read-only memory is latched in a BILBO register enhanced for use as a counter for large count. During the endurance test (Autocycle), the microsequencer (MC), using enhanced counter, monitors the number of on-chip controlled endurance test cycles. During the parametric characterization test (AutoVccMax/Min), an on-chip digital-analog converter (DAC) causes stepped changes in the supply voltage (Vcc) furnished to both the data cells (10) and the reference cells (10) of the memory.

18 Claims, 5 Drawing Sheets

ON-CHIP AUTOMATIC PROCEDURES FOR MEMORY TESTING

BACKGROUND OF THE INVENTION

The present invention relates to a nonvolatile, integrated-circuit memory array such as a flash erasable, electrically programmable read-only-memory (flash EPROM or flash EEPROM) array. In particular, the invention relates to two on-chip control operations: (a) endurance testing of such memories for programming, erasing and/or compaction and (b) finding the maximum and/or minimum power supply voltage for operation of such memories.

Flash EPROMs of the type discussed herein are described in: (a) "A Single Transistor EEPROM cell and its implementation in a 512K CMOS EEPROM", S. Mukherjee et al., IEDM 1985 (p. 616–619) and in (b) "A 90ns 100K Erase/Program Cycle Megabit Flash Memory", V. Kynett et al., ISSCC 1989 (p. 140–141). The topic of reference (a) is also discussed in U.S. Pat. No. 4,698,787.

Early flash memories required complex commands from a separate-chip microprocessor and/or tester when performing write and erase operations, including write and erase operations performed during initial test procedures. For example, instead of a simple erase command from microprocessor, the microprocessor furnished such information as the length of the erase pulse, and furnished a test routine to check for proper erasure. Instead of a simple test cycle command from the tester, the tester repeatedly issued write and erase operations to the memory. The tester also kept track of the number of cycles a flash memory endured. While the commands for write/erase and test operations could be changed to accommodate manufacturing variations among chips of the same type, those changes had to be programmed by system users or test engineers, requiring additional test time during manufacture.

As flash memory technology evolves, and as memory storage capacity increases, the demand by test engineers for increased ease of testing, decreased test time and decreased testing hardware has led to the development of automated test instructions for programming/erasing operations and for finding parametric data of flash memories. Automated program/erase and test control instructions are embedded in write state machine (WSM) architecture of such flash EPROMs. The codes for those control instructions are stored in a control-read-only-memory (CROM) in the WSM. With automated program/erase and test instructions embedded in the WSM, the external-to-chip testers only need to furnish a simple command. That is, the external-to-chip tester need not furnish pulse length directions and other information necessary to perform the write/erase or test operations. The embedded write/erase and test control instructions allow a memory manufacturer to provide on-chip write/erase and test control instructions to compensate for manufacturing variations.

Forming, on a memory chip, a microprocessor having all of the features of an external-to-memory-chip microprocessor or tester is not practical because memory chips generally have limited space outside of the memory array. However, one prior-art implementation of embedded control instructions is a microcode ROM-based implementation that provides maximum flexibility using a relatively small chip area to perform several test operations or procedures. The prior-art ROM-based implementation includes a control-read-only-memory (CROM), containing micro instructions and control data, a program counter multiplexer (PCM) to select instructions from the control-read-only-memory (CROM), a micro-instruction decoder (MID), an input test input multiplexer (TIM) to test control signals, an optional status output register (SOR) to generate control signals, and an optional subroutine stack (SS) to allow function calls. A microcode ROM-based implementation of the foregoing type is described in U.S. Pat. No. 5,359,570 and in U.S. Pat. No. 5,491,660.

SUMMARY OF THE INVENTION

The on-chip-controlled endurance test and the parametric characterization test described in this invention save test time and, in many cases, hardware. Both tests are performed automatically on the memory chip upon transmittal of a single command to the chip from the tester. This decreases the burden on the tester, including reducing the time required for setting up the tester to execute the flow and the time required to monitor the test. That is, the automated test procedures of this invention run faster because the on-chip tester requires fewer externally issued commands and requires fewer external status checks. The procedures of this invention permit the external tester to have a smaller number of input/output pins. Because the test data are set up internally without going through a large number of input/output data pins, the cost of the external test hardware is decreased. Specifically, the endurance test, also called the "Autocycle" test, automatically cycles the memory chip through any combination of programming, erasing, and/or compaction operations until either a failure has been detected or the required number of the test cycles has been completed. The parametric characterization test, also called the "AutoVccMax/Min" test mode, determines automatically the VccMax or VccMin value for operation using data stored in the memory chip.

The endurance test uses a microsequencer that includes an on-chip built-in-logic-block-observation (BILBO) register to check information in a control-read-only memory (CROM). Output data from the control-read-only memory is latched in a BILBO register enhanced for use as a counter for large count. The microsequencer receives an endurance test command, and using enhanced counter, monitors the number of on-chip controlled endurance test cycles. During the parametric test, an on-chip digital-analog converter causes stepped changes in the supply voltage furnished to both the data cells and the reference cells of the memory. The microsequencer receives a parametric data test command and performs the parametric data test.

DETAILED DESCRIPTION OF THE INVENTION

Figure 1:
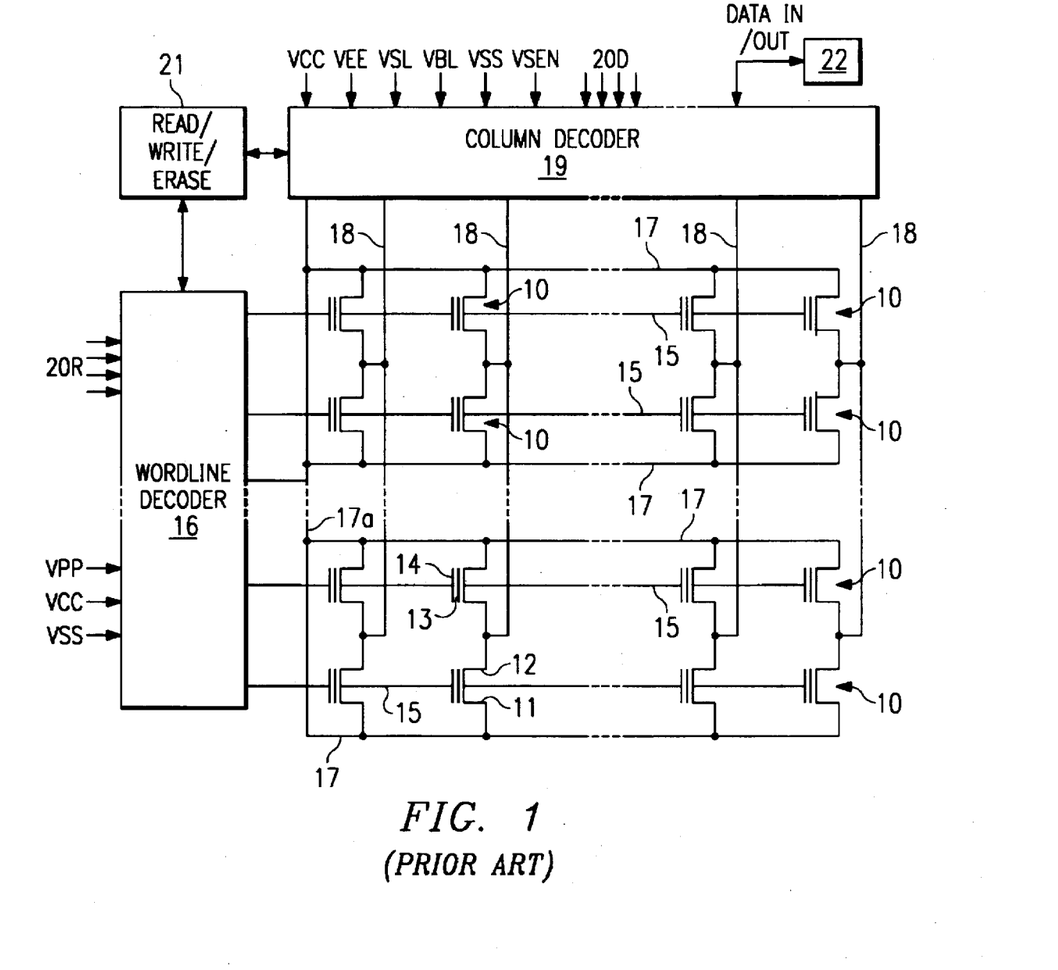
FIG. 1 is an electrical schematic diagram, in partial block form, of a memory cell array.

Referring to FIG. 1, an example array of memory cells, which is an integral part of a memory chip, is shown for the purpose of illustrating use of the methods of this invention. Each cell is a floating-gate transistor 10 having a source 11, a drain 12, a floating gate 13, a control gate 14. Each of the control gates 14 in a row of cells 10 is connected to a wordlines 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20R and to signals from Read/Write/Erase control circuit 21 (or microprocessor 21), to apply a preselected positive voltage Vcc (approx. +5 V) to the selected wordline 15, and to apply a low voltage (ground or Vss) to deselected wordlines 15. The column decoder 19 functions to apply a preselected positive voltage Vsen (approx. +1 V) to at least the selected drain-column line 18 and to apply a low voltage (0 V) to the source line 17. The column decoder 19 also functions, in response to signals on address lines 20D, to connect the selected drain-column line 18 of the selected cell 10 to the DATA IN/OUT terminal 22. The conductive or nonconductive state of the cell 10 connected to the selected drain-column line 18 and the selected wordline 15 is detected by a sense amplifier (not shown) connected to the DATA IN/OUT terminal 22.

During a flash-erase mode, the column decoder 19 functions to leave all drain-column lines 18 floating (connected to a high impedance such as field-effect transistor biased in "OFF" condition). The wordline decoder 16 functions to connect all the wordlines 15 to Vss, which may be ground or 0 V. The column decoder 19 also functions to apply a positive voltage Vee (approx. +10 V to +15 V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15 is at reference voltage Vss, the cell 10 remains in the nonconducting state during erase. Over-erased cells are corrected by one of several compaction procedures.

In a write or program mode, the wordline decoder 16 may function, in response to wordline address signals on lines 20R and to signals from Read/Write/Erase control circuit 21, (or microprocessor 21) to place a preselected first programming voltage Vpp (approx. +12 V) on a selected wordline 15, including a selected control-gate 14. Column decoder 19 also functions to place a second programming voltage Vb1 (approx. +5 to +10 V) on a selected drain-column line 18 and, therefore, the drain 12 of selected cell 10. Source lines 17 are connected to reference potential Vss, which may be ground. All of the deselected drain-column lines 18 are connected to reference potential Vss or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with the control gate 14 at 0 V). For memory cells 10 fabricated in accordance with the example embodiment, the coupling coefficient between a control gate 14/wordline 15 and a floating gate 13 is approximately 0.6. Therefore, a programming voltage Vpp of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with +5 V on its control gate, a state which is read as a "zero" bit. Non-programmed cells 10 have source-drain paths under the floating gate 13 that are conductive with +5 V on their control gates, and those cells 10 are read as "one" bits.

For convenience, a table of read, write and erase voltages is given in TABLE I below:

TABLE I

| Operation | Read | Flash Erase | Program |
|---|---|---|---|
| Selected Wordline | +5 V | 0 V (All) | +12 V |
| Deselected Wordlines | 0 V | — | 0 V |
| Selected Drain Line | +1 V | Float (All) | +5 V to +10 V |
| Deselected Drain Lines | 0 V or Float | — | 0 V |
| Source Lines | 0 V | +10 V or +15 V | 0 V |

Figure 2:
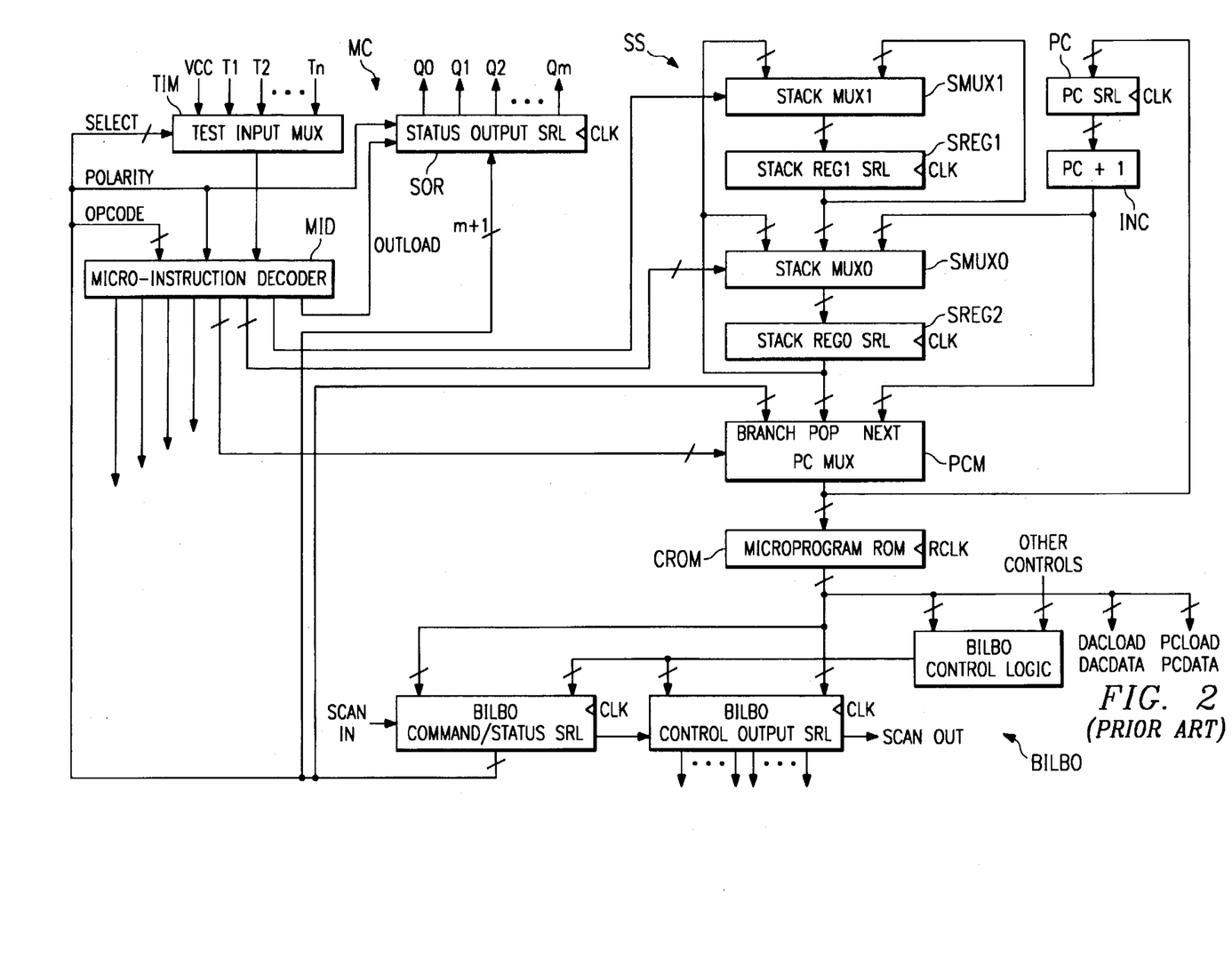
FIG. 2 is a circuit, in block form, illustrating an embodiment of a prior-art control method for programming, erasing or compacting the memory cell array.

FIG. 2 illustrates a prior-art embodiment in block diagram form of the circuitry described in U.S. Pat. No. 5,491,660 for control of programming, erasing or compacting the memory cell array shown in FIG. 1. The circuit of FIG. 2 includes the following:

a) A Microprogram-Read-Only-Memory or Control-Read-Only-Memory CROM. The Microprogram ROM CROM may be a nonvolatile array of erasable cells 10 or other type nonvolatile array. The outputs of the CROM, going through the built-in-logic-block-observation registers to be described next, are used for microcontrol and controlling the internal circuit operation of the flash EPROM of FIG. 1 b) Built-In-Logic-Block-Observation BILBO registers. The BILBO registers are used to check if the information in the microprogram memory is correct, to latch output data from the CROM. The BILBO registers are usable as a counter and/or a shifter. The latched output data include, for example, outputs indicating activation or deactivation of the high-voltage circuitry on the chip, instruction of the address counter and decoder circuitry, and activation of the data comparison circuitry.

c) A Microsequencer Circuit MC. The Microsequencer Circuit MC includes a Program Counter PC; an Incrementer INC; a Program Counter Multiplexer PCM; a Micro-Instruction Decoder MID; a Test Input Multiplexer TIM; a Subroutine Stack SS including a first Stack Multiplexer SMUX1, a first Stack Register SREG1, a second Stack Multiplexer SMUX0, and a second Stack Register SREG0; and an Status Output Register SOR.

The Program Counter PC contains the address of the currently addressed microcode word.

The incrementer INC takes the current Program Counter PC value and, from it, generates the next microcode address.

The Program Counter Multiplexer PCM of this example is a three-to-one multiplexer. Under the control of the Micro-Instruction Decoder MID (described in the next paragraph) the Program Counter Multiplexer PCM selects, as the address input the microprogram memory CROM, either a field from the current microcode word (the current value of second stack register SREG0) or the incrementer INC.

The Micro-Instruction Decoder MID decodes the operation code field of the microcode word from the Test Input Multiplexer TIM and other inputs. The MID controls the input state of Program Counter Multiplexer PCM, the first Stack Multiplexer SMUX1, the second Stack Multiplexer SMUX0, and the Status Output Register SOR.

The Test Input Multiplexer TIM selects one of n inputs (32 inputs, for example) to test for condition branch instructions.

The Subroutine Stack SS consists of first Stack Multiplexer SMUX1, first Stack Register SREG1, second Stack Multiplexer SMUX0 and second Stack Register SREG0. The Subroutine Stack SS allows nesting of subroutine calls two deep.

The Status Output Register SOR is, for example, a thirteen bit register whose bits can be set or cleared.

The inputs T1–Tn to the Test Input Multiplexer TIM are test condition inputs from other logic circuitry on the chip, the other logic circuitry being triggered by input from an off-chip microprocessor.

The outputs from Status Output Register SOR include, for example, outputs for microsequencer status (done or not), for an overlay block, for program/erase failure, for stop clock oscillator, for select column, for increment sector counter, for timer override, for increment counter, for set-signature test mode, for override pulse timer by external clock, for force row-redundant match, for force column-redundant match, for select bit or byte correction, and for access to overlay block.

Once the Control-Read-Only-Memory CROM, the Built-In-Logic-Block-Observation BILBO registers and the Microsequencer Circuit MC have been integrated into a flash memory chip, the program, erase and/or compaction operations upon the array of memory cells 10 as described in FIG. 1 are implemented by programming a set of microcodes into the Control-Read-Only-Memory CROM. In the prior art, however, there is no special operation implemented using a microcode approach to reduce test time or hardware for: (a) endurance testing for programming, erasing and/or compaction of such memories, and (b) finding automatically the VccMax or VccMin value for operation using data stored in such memories.

Conventionally, the endurance test is done by issuing a "full-chip" erase command or a series of block erase commands to the flash memory from the tester for each cycle of program, erase and/or compaction operations. At the end of each cycle, the status register on the flash memory is read and recorded by the tester. If the cycle passes, the tester increments a counter inside the tester and issues another "full-chip" erase command to continue the endurance test. Otherwise, if the chip fails, the tester stops and records from the counter the number of operation cycles that the flash memory has undergone prior to failure.

Figure 3:
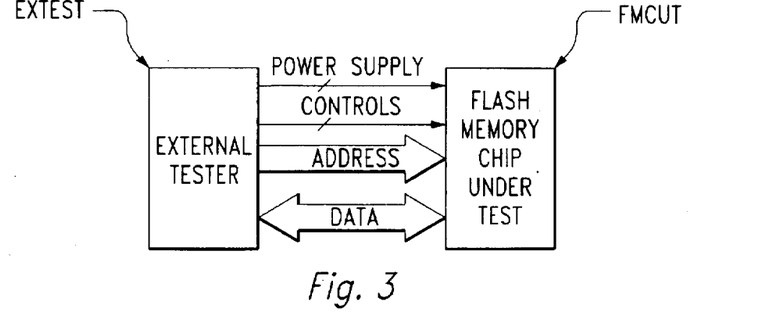
FIG. 3 is a circuit, in block form, illustrating an embodiment of a typical set up for the parametric characterization of a memory chip.

Similarly, the prior-art parametric characterization (finding) of the VccMax (of the programmed) or VccMin (of the erased) data stored in the memory cells 10 is exhaustively done "external" to the chip by using the tester to loop through all of the addresses of the memory cells 10. FIG. 3 illustrates a typical set up for the parametric characterization of a memory chip. The external tester EXTEST supplies the supply voltage source Vcc at 0.1 V steps, for example, either "up" for finding VccMax (e.g., 5.0 V, 5.1 V, 5.2 V, . . .) for the programmed data, or "down" for finding VccMin (e.g., 5.0 V, 4.9 V, 4.8 V, . . .) for the erased data, the data stored inside the flash memory chip under test FMCUT. At each voltage Vcc step, the address space of the memory cells 10 is stepped through to read the data. The test stops if any data read "failed". A "failed" reading indicates that the current Vcc voltage level is indeed either the VccMax for all programmed data stored in the memory array or the VccMin for all erased data stored in the memory array.

This invention "automates" both the foregoing endurance test and the foregoing parametric characterization test by integrating those tests into an on-chip control method that decreases the burden on the tester and saves time required for programming the tester to execute the flow and monitor the test results. In addition, the automated tests run faster because of elimination of the need between cycles for the tester to issue commands externally and to check status externally. In cases where the tester has a limited number of input/output pins, this approach is extremely crucial because all data is set up internally, eliminating the need to pass through the input/output data pins. The cost of supplying extra input/output pins and the circuitry attached thereto is eliminated.

Figure 4:
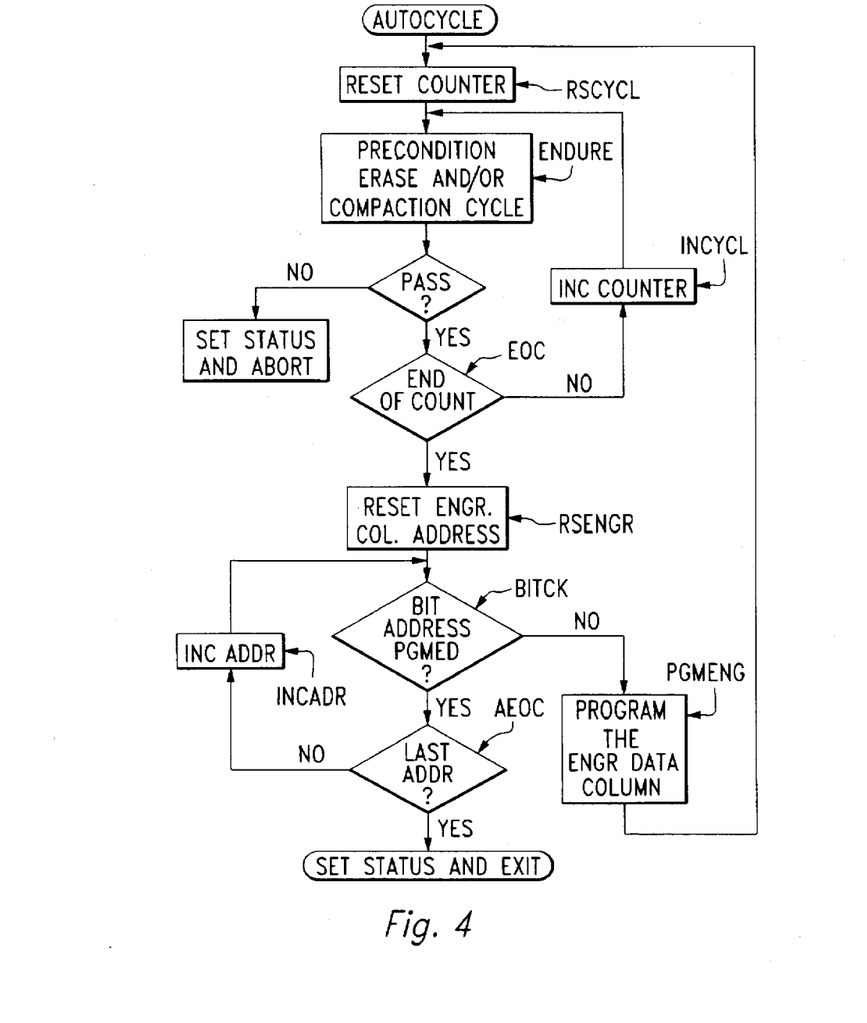
FIG. 4 is a flow chart, in block form, illustrating an example automated endurance test flow, also known as the "Autocycle" mode of test.

FIG. 4 illustrates the automated endurance test flow, also called "Autocycle" test mode, which is encoded in the Control-Read-Only-Memory CROM of FIG. 2. As soon as the on-chip controller receives the Autocycle mode command (which can be either a normal mode or special test mode command), the endurance test flow starts by first resetting the cycle counter RSCYCL. The implementation of counter RSCYCL is described later. The full-chip (or all-blocks) mode of test (ENDURE), which is any combination of preconditioning, erasing and/or compaction operations, is executed next, representing one cycle of the endurance test for the memory cell array. If the endurance test fails, the fail and ready/busy status bits are set to signify that the test is unsuccessful, and the test flow is stopped. If the endurance test passes, the cycle counter is checked for end-of-count (EOC). If the counter has not reached the end of the count (for example, M, which is predetermined by the design of the counter), the cycle counter increments by one (INCYCL) and the test flow loops back to the full-chip (or all blocks) mode (ENDURE) to start another cycle of endurance test of the memory cells 10 of the array. If the counter reaches the end of the count M, the flow goes to a routine or subroutine that records the number of endurance cycles completed. This subroutine is described later, after the explanation of the engineering data columns and the design of the cycle counter.

In order to implement the automated test procedure without increasing the logic circuitry on the chip, this invention takes advantage of the already available address counters and engineering data columns for storing the number of the cycle counts. The address counters are used for the access of each memory word in the main memory cells 10 or engineering data columns. The engineering data columns, which are non-erasable nonvolatile memory cells 10, are commonly used for storing engineering test data relating to the memory chip. The methods for construction of address counters and engineering data columns as well as their operation are well-known in this art. Generally and practically, the size of the engineering data columns is relatively small and is dependent on the number of rows that the main memory cell array has. In the procedure of this invention, each bit or word of the engineering data columns is used to represent one count of the endurance cycle. However, since there is a limited number of engineering data columns, an addition of cycle counter is used necessarily to keep track of the number (up to millions) of the endurance cycles.

This invention also takes advantage of the already available counter normally used to keep pulse count and commonly found in flash memory arrays having on-chip control circuitry. One example of such circuitry is the Linear Feedback Shift Register LFSR found in the Built-In-Logic-Block-Observation BILBO registers as described in U.S. patent application Ser. No. 08/315,526, filed Sep. 30, 1994, also assigned to Texas Instruments Incorporated (TI-19391).

Figure 5:
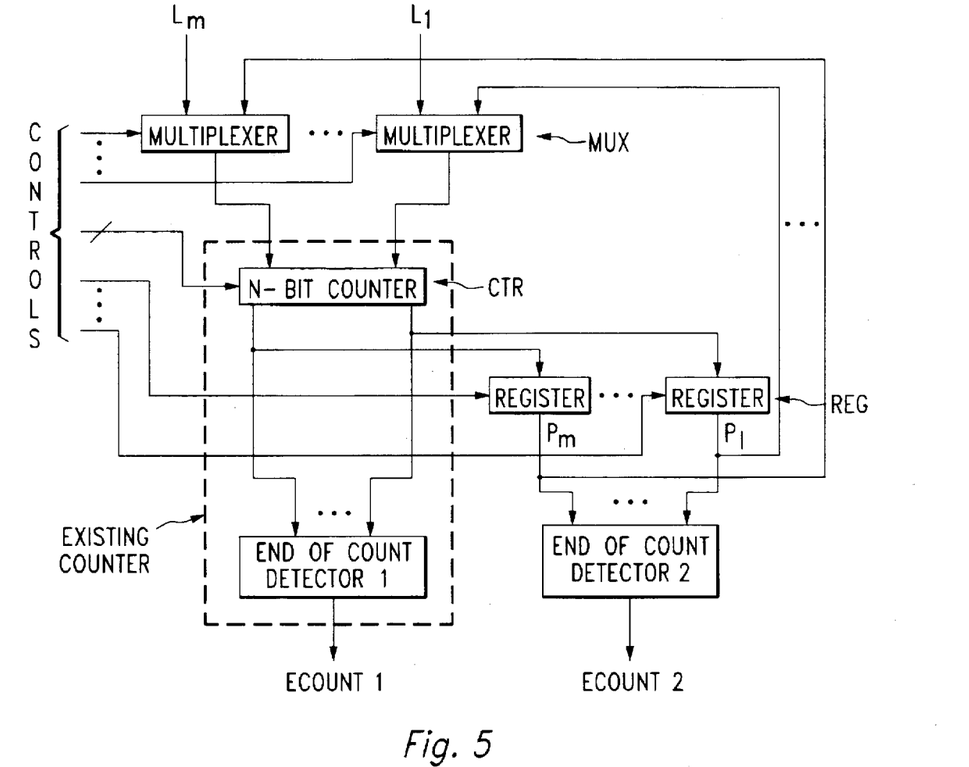
FIG. 5 is a circuit, in block form, illustrating an embodiment creating an additional counter by modifying an existing counter.

FIG. 5 illustrates the design of an additional counter by modifying an existing counter enclosed by dotted lines. As shown in FIG. 5, the multiplexer MUX is used to pass the data of initial count value (Lm...L1), or the previously stored value of the additional counter of this invention (Pm...P1), to the counter CTR. If the additional counter is used, either the initial count value, or the previously stored value, is first loaded into the counter. Then, the counter starts its counting function. After the counting is complete, the registers REG latch the resulting count value for storage. The stored resulting count value is used later either for reloading into the counter for continuous counting or for checking for the end of count. In general, an additional m-bit counter is obtained by adding a set of m multiplexers and registers or latches, m feedback paths and an m-bit end-of-count detector, modifying the control signals, and, changing the control procedure (for example, the control-read-only-memory CROM code as mentioned before). The maximum count of the counter is, obviously, 2 to the power of m ($2^m$), or M which has been used as an example before.

By taking the advantage of using the engineering data columns and the addition of an m-bit counter, the maximum endurance cycles that can be recorded is the product of the number, C, of bits or words stored in the engineering data columns and the maximum count in the cycle count, M. If M=1024 (a 10-bit counter), then as little as 1024 (1K) bits or words is enough for a one million cycle count.

The routine or subroutine shown in FIG. 4 for keeping track of the number of counts of every M endurance cycles using the address counters and engineering data columns is now explained. Each time the cycle counter reaches the end of count (EOC), the address counters used for addressing the engineering data columns is reset to zero (RESNGR). The state of the engineering data column cell or cells 10 of the current address is checked (BITCK). If the cell 10 is programmed, the address counters check for end of count (AEOC). If the end of address count has been reached, the ready status bit is set to signify that the test flow has been completed successfully and then the test is stopped. If the end of address count has not been reached, the address counters are incremented (INCADR) and the state of the engineering data column cell or cells 10 of the current address is checked again. If the engineering data column cell 10 of the current address is in erased state (not programmed), it is programmed (PGMENG) and the test flow returns to resetting the cycle count RSCYCL and continues. Note that in all flash memory designs having on-chip control, the very same address counters are used for the access of the engineering data columns and the main memory cells 10 to save chip area. The routine just described is necessary since the address counters are reset for every endurance cycle of the main memory cells 10. Otherwise, this routine is simply: (a) increment the address counters dedicated for the access the engineer columns, (b) program the engineer column cells 10 at the current address, (c) return to resetting the cycle count RSCYCL and (d) continue the test flow.

In common flash design, polling the status bit (also known as the ready/busy bit) of the chip under test determines whether or not the test is completed. Likewise, in the Autocycle mode, polling the ready/busy status bit is a check for completion. After completion, the fail status bit is read to determine the test result. If the fail status bit has been set, its corresponding engineering data columns are read to determine the minimum number of sets of M endurance cycles that were completed before failure. If a scan test is also available on the chip, the value of the cycle counter is scanned out to determine the exact number of completed cycles before chip failure. If the fail status bit is not set, the total number of completed cycles is simply the number C of engineering data column cells 10 for keeping track of the test multiplied by the maximum count M of the cycle counter, or C×M. In the case of a design that does not have engineering data columns, construction of an extra array of nonvolatile cells 10 and associated logic is required to accommodate the Autocycle mode.

Figure 6:
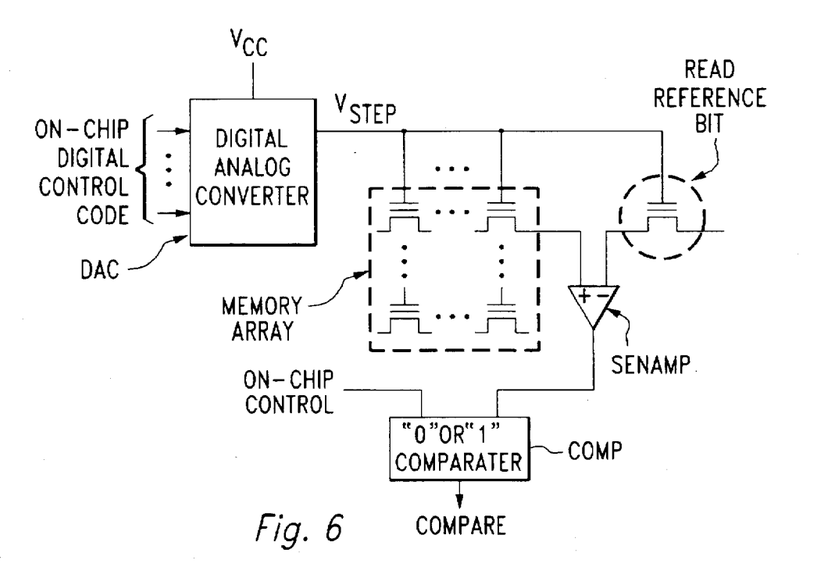
FIG. 6 is a circuit, in block form, illustrating an on-chip control method for finding the VccMax or VccMin for operation using data stored in the memory cell array.

For the automatic VccMax or VccMin test, which is a parametric characterization test, FIG. 6 illustrates an on-chip embodiment of the invention in block diagram. This test, as described previously, is to determine either the VccMax voltage level of the programmed data or the VccMin voltage level of the erased data stored in a flash memory chip. As shown in FIG. 6, the Digital Analog Converter DAC is simply a variable voltage source generator digitally controlled by the on-chip controller, which was is constructed on the flash memory chip. The construction and operation of such digital controlled variable voltage generator is well-known in this art.

The variable step voltage output, Vstep, shown in FIG. 6, is the voltage supplied to the word lines of the flash memory cells 10 and to its corresponding read reference cell 10. Based on the condition of a memory cell 10 and the value of voltage Vstep, the current sense amplifier SENAMP produces the read result as either "0" or "1". At the normal value of Vstep, which may be the 5 V value shown in TABLE I as "Read" "Selected Wordline", the read result is "0" if the cell 10 is previously programmed or is "1" if the cell 10 is previously erased. The read data is compared (i.e., by a simple exclusive-OR function, XOR) to a "0" (if finding VccMax of all programmed cells 10) or "1 " (if finding VccMin of all erased cells 10) inside a comparater COMP. As Vstep steps through various voltage levels digitally controlled by the on-chip controller, if any read result is found different from its normal one, the comparater sets its output to "1" indicating either the VccMax or VccMin is found. The test is then stopped and the code representing the current Vstep level (DAC code) is read, if desired, by a scanning technique or by status registers. Note that the voltage range of Vstep must be predetermined beforehand; otherwise, this test is meaningless if VccMax or VccMin does not fall in the range of Vstep. The construction and operation of such current sense amplifier and comparater is well-known in this art.

Figure 7:
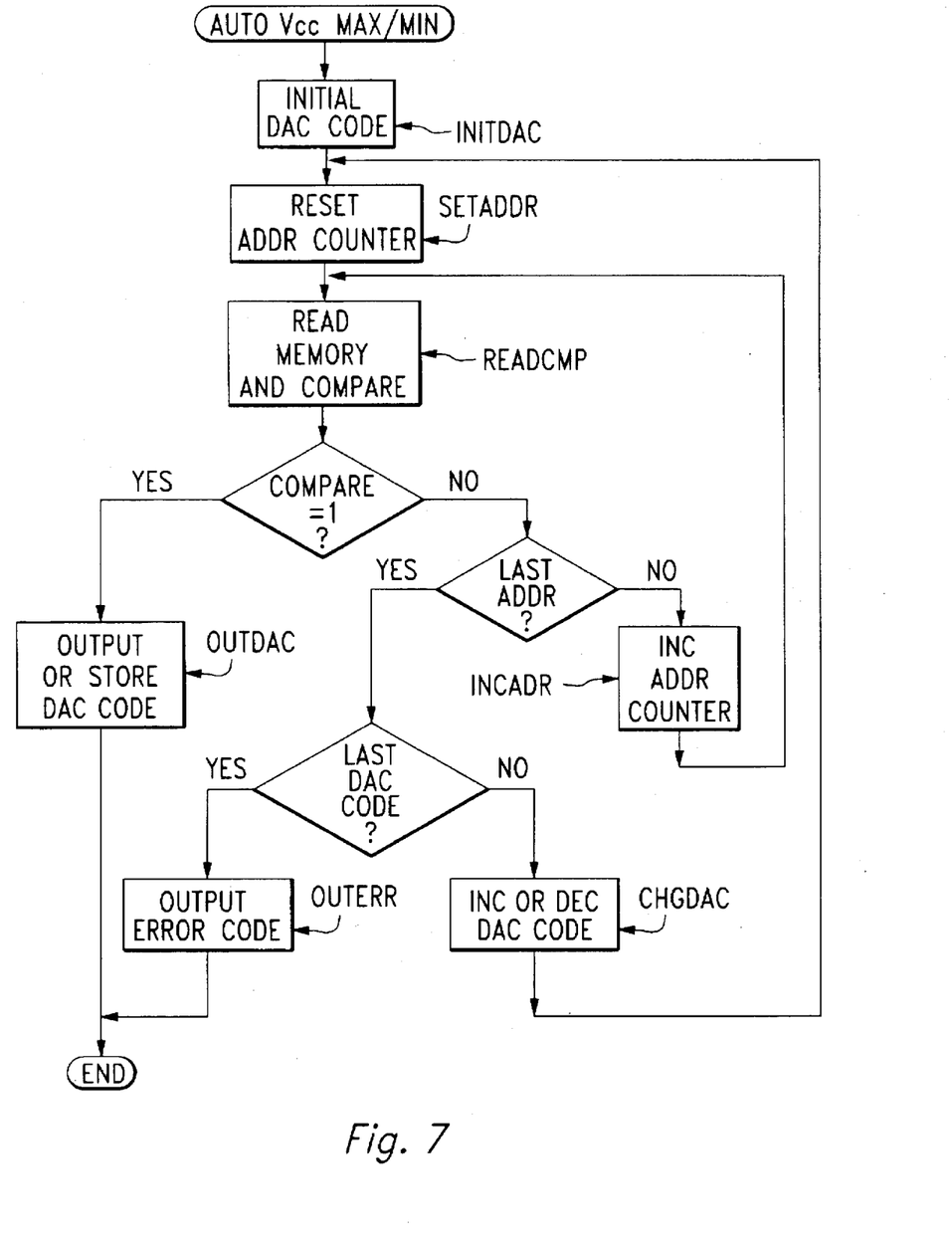
FIG. 7 is a flow chart, in block form, illustrating an example automated parametric characterization test flow, also known as the "AutoVccMax/Min" mode of test.

FIG. 7 illustrates the test flow controlling the circuit blocks shown in FIG. 6, called the "AutoVccMax/Min" test mode, which is coded into the Control-Read-Only-Memory CROM shown in FIG. 2 in the same manner as the "Autocycle" test mode as described previously. As shown in FIG. 7, the test flow starts with reset or initialization of the DAC code (INITDAC), which controls the voltage level sent to the wordlines of both memory and reference cells 10. The address counter addressing the memory array is reset (SETADDR) before the memory cell 10 is read and compared (READCMP). If the compare output is set to "1" indicating the finding of either VccMax or VccMin, the test flow stops after the DAC code is outputted to the status register or remains inside the current register waiting for a scan later (OUTDAC). Otherwise, the address counter is checked to see if the last memory cell 10 is being read. If the last cell is not being read, the address counter increments (INCADR) and the next memory cell 10 is read and compared. If the last cell 10 is being read, then the DAC code is checked. If the DAC code has reached either the maximum or minimum level, the flow is stopped, indicating that the VccMax or VccMin value is outside the predetermined range or that there is a read error (OUTERR). If the DAC has not reached the maximum or minimum level, the DAC code is incremented or decremented to change the Vstep level (CHGDAC) and the address counter is reset. All memory cells 10 are read and compared again using the new Vstep level, continuing until VccMax or VccMin is found or an error occurs.

Both test methods mentioned in this invention are useful for any device that has embedded control instructions for operation and that requires continuous endurance and parametric tests.

While this invention has been described with respect to an illustrative embodiment, this description is not intended to be construed in a limiting sense. In particular, this invention is applicable to use with power supplies having voltage outputs different from the examples used herein. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A method for performing an endurance test on a memory array formed on a single integrated-circuit chip in response to microcodes from an external source, said method comprising:

forming a control-read-only-memory on said chip;

programming instructions for performing said endurance test in said control-read-only-memory;

forming a microsequencer on said chip to perform, in response to said microcodes from said external source, said endurance test of said memory array according to said instructions programmed in said control-read-only-memory, said microsequencer including a test multiplexer for receiving microcodes from said external source and for coupling a first signal to an instruction decoder, said instruction decoder also receiving an operation code from said control-read-only-memory, said instruction decoder controlling a subroutine stack, including a program counter multiplexer for receiving said operation code, for receiving a second signal from said subroutine stack, and for receiving a third signal from an incrementer, said program counter multiplexer furnishing a fourth signal to said control-read-only-memory, said incrementer taking said fourth signal from said program counter multiplexer and, from said fourth signal, generating said third signal as a next microcode address;

forming at least one built-in-logic-block-observation register on said chip to check information in said control-read-only memory and to latch output data from said control-read-only memory, said built-in-logic-block-observation register usable as a counter;

causing said microsequencer to receive an endurance test command; and using said built-in-logic-block-observation register to count the number of endurance test cycles.

2. The method of claim 1, wherein said memory array is a nonvolatile memory array.

3. The method of claim 1, wherein said control-read-only memory array is a mask-programmable nonvolatile memory array.

4. A method for performing a parametric data test on a memory array formed on a single integrated-circuit chip in response to microcodes from an external source, said method comprising:

forming a control-read-only-memory on said chip;

programming instructions for performing said parametric data test in said control-read-only-memory; and forming a microsequencer on said chip to perform, in response to said microcodes from said external source, said parametric data test of said memory array according to said instructions programmed in said control-read-only-memory, said microsequencer including a test multiplexer for receiving microcodes from said external source and for coupling a first signal to an instruction decoder; said instruction decoder also receiving an operation code from said control-read-only-memory, said instruction decoder controlling a subroutine stack, including a program counter multiplexer for receiving said operation code, for receiving a second signal from said subroutine stack, and for receiving a third signal from an incrementer, said program counter multiplexer furnishing a fourth signal to said control-read-only-memory; said incrementer taking said fourth signal from said program counter multiplexer and, from said fourth signal, generating said third signal as a next microcode address;

forming a digital-analog converter on said chip to cause stepped changes in supply voltage furnished to data cells of said memory and to reference cells of said memory;

causing said microsequencer to receive a parametric data test command; and performing said parametric data test.

5. The method of claim 4, wherein said parametric data test determines a maximum value of supply voltage for operation of said memory array.

6. The method of claim 4, wherein said parametric data test determines a minimum value of supply voltage for operation of said memory array.

7. The method of claim 4, wherein said memory array is a nonvolatile memory array.

8. The method of claim 4, wherein said control-read-only memory array is a mask-programmable nonvolatile memory array.

9. A method for monitoring the number of on-chip, particular-type tests on a memory array formed on a single integrated-circuit chip in response to microcodes from said external source, said method comprising:

forming a control-read-only-memory on said chip;

programming instructions for performing sequential said on-chip tests in said control-read-only-memory; and forming a microsequencer on said chip to monitor, in response to said microcodes from said external source, said number of said on-chip tests of said memory array according to said instructions programmed in said control-read-only-memory, said microsequencer including a test multiplexer for receiving microcodes from said external source and for coupling a first signal to an instruction decoder; said instruction decoder also receiving an operation code from said control-read-only-memory, said instruction decoder controlling a subroutine stack, including a program counter multiplexer for receiving said operation code, for receiving a second signal from said subroutine stack, and for receiving a third signal from an incrementer, said program counter multiplexer furnishing a fourth signal to said control-read-only-memory, said incrementer taking said fourth signal from said program counter multiplexer and, from said fourth signal, generating said third signal as a next microcode address;

forming as part of said microsequencer an enhanced m-Bit counter and a separate end-of-count detector on said chip, said m-Bit counter receiving an initial count and a signal from said external source and transmitting count information to said separate end-of-count detector and program counter multiplexer, said separate end-of-count detector furnishing a scanning output.

10. The method of claim 9, wherein said memory array is a nonvolatile memory array.

11. The method of claim 9, wherein said control-read-only memory array is a mask-programmable nonvolatile memory array.

12. The method of claim 9, wherein said particular type of on-chip test is an endurance test.

13. The method of claim 9, wherein said particular type of on-chip test is a parametric test.

14. A circuit for monitoring the number of on-chip, particular-type tests of a memory array formed on a single integrated-circuit chip in response to microcodes from an external source, said circuit comprising:

a control-read-only-memory on said chip, said control-read-only-memory storing instructions for performing said on-chip tests; and a microsequencer on said chip to perform, in response to said microcodes from said external source, monitoring the number of on-chip tests of said memory array according to said instructions programmed in said control-read-only-memory, said microsequencer including a test multiplexer for receiving microcodes from said external source and for coupling a first signal to an instruction decoder; said instruction decoder also receiving an operation code from said control-read-only-memory, said instruction decoder controlling a subroutine stack, including a program-counter multiplexer for receiving a second signal from said subroutine stack and a third signal from an incrementer, said program-counter multiplexer furnishing a fourth signal to said control-read-only-memory; said incrementer taking said fourth signal and generating said third signal as a next microcode address; and said microsequencer also including an enhanced m-Bit counter and a separate end-of-count detector on said chip, said m-Bit counter receiving signals from said external source and receiving an initial count, said m-Bit counter transmitting count information to said separate end-of-count detector, said separate end-of-count detector furnishing a scanning output.

15. The circuit of claim 14, wherein said particular-type of test is an endurance test.

16. The circuit of claim 14, wherein said particular-type of test is a parametric data test.

17. The circuit of claim 14, wherein said memory array is a nonvolatile memory array.

18. The method of claim 14, wherein said control-read-only memory array is a mask-programmable nonvolatile memory array.

* * * * *